US012675134B2

(12) United States Patent
Crowley et al.

(10) Patent No.: US 12,675,134 B2
(45) Date of Patent: Jul. 7, 2026

(54) FLUID DEFLECTOR FOR ELECTRONIC DEVICES

(71) Applicant: Apple Inc., Cupertino, CA (US)

(72) Inventors: Patrick J. Crowley, Santa Clara, CA (US); Woojin Jung, San Mateo, CA (US); Eric T. Chiang, San Francisco, CA (US); Ross L Jackson, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 239 days.

(21) Appl. No.: 18/159,530

(22) Filed: Jan. 25, 2023

(65) Prior Publication Data

US 2024/0077911 A1     Mar. 7, 2024

Related U.S. Application Data

(60) Provisional application No. 63/374,736, filed on Sep. 6, 2022.

(51) Int. Cl.
H05K 5/02 (2006.01)
G06F 1/16 (2006.01)

(52) U.S. Cl.
CPC ......... G06F 1/1656 (2013.01); H05K 5/0213 (2013.01); H05K 5/0217 (2013.01); G06F 1/1688 (2013.01)

(58) Field of Classification Search
CPC ...... G06F 1/1616; G06F 1/1626; G06F 1/163; G06F 1/1656; G06F 1/1658; G06F 1/1688; H05K 5/0213; H05K 5/0214; H05K 5/0215; H05K 5/0216; H05K 5/0217; H05K 5/061; H05K 7/20145; H04R 1/086; H04R 1/023; H04R 1/44; G04B 37/08
See application file for complete search history.

(56) References Cited

U.S. PATENT DOCUMENTS

| | | | |
|---|---|---|---|
| 9,832,567 B2 * | 11/2017 | Zhang | H05K 5/0215 |
| 9,843,659 B2 * | 12/2017 | Yamaguchi | H04M 1/035 |
| 9,872,094 B2 * | 1/2018 | Meyer | H04R 1/023 |
| 10,021,800 B1 * | 7/2018 | Zhang | H05K 5/0213 |
| 10,165,694 B1 * | 12/2018 | Werner | H04R 1/028 |
| 11,240,595 B2 * | 2/2022 | Barney | H04R 1/025 |
| 11,389,760 B2 * | 7/2022 | Oostveen | B29C 45/14336 |
| 2011/0168480 A1 * | 7/2011 | Sterling | H04R 1/2803 |
| | | | 181/176 |
| 2013/0025457 A1 * | 1/2013 | Furuuchi | F21S 45/37 |
| | | | 96/4 |
| 2016/0097508 A1 * | 4/2016 | Tsai | F21S 45/49 |
| | | | 362/547 |

(Continued)

FOREIGN PATENT DOCUMENTS

CN          108744723 A   *  11/2018  ......... B01D 39/1669

*Primary Examiner* — Gage Crum

(74) *Attorney, Agent, or Firm* — Dorsey & Whitney LLP

(57) ABSTRACT

In at least one example of the present disclosure, a portable electronic device includes a housing, an internal volume within the housing, a port having a perimeter defined by the housing, the port in fluid communication with the internal volume and an external environment, a water deflector disposed inside the housing adjacent to the port, the water deflector extending at least a length and a width of the port, and openings disposed in the water deflector. The openings in the water deflector are aligned outside of the perimeter of the port.

19 Claims, 8 Drawing Sheets

(56)          References Cited

U.S. PATENT DOCUMENTS

| 2016/0158678 | A1* | 6/2016 | Ishii | ................... | B01D 46/2403 |
| | | | | | 55/497 |
| 2017/0292000 | A1* | 10/2017 | Furuyama | ................ | C08J 7/123 |
| 2018/0081406 | A1* | 3/2018 | Kita | ......................... | H04R 9/08 |
| 2019/0072903 | A1* | 3/2019 | Park | ....................... | G04G 17/02 |
| 2019/0104367 | A1* | 4/2019 | Xu | ........................... | H04R 9/06 |
| 2019/0307006 | A1* | 10/2019 | Zhou | ................. | B01D 46/0043 |
| 2021/0076127 | A1* | 3/2021 | Barney | ................. | H04R 1/025 |
| 2021/0089160 | A1* | 3/2021 | Han | .................... | G06F 3/04883 |
| 2021/0153370 | A1* | 5/2021 | Yokoyama | ........... | H05K 5/0217 |
| 2021/0258672 | A1* | 8/2021 | Banter | ................... | H04R 1/086 |
| 2022/0225013 | A1* | 7/2022 | Bønnelykke | ........... | H04R 1/023 |

* cited by examiner

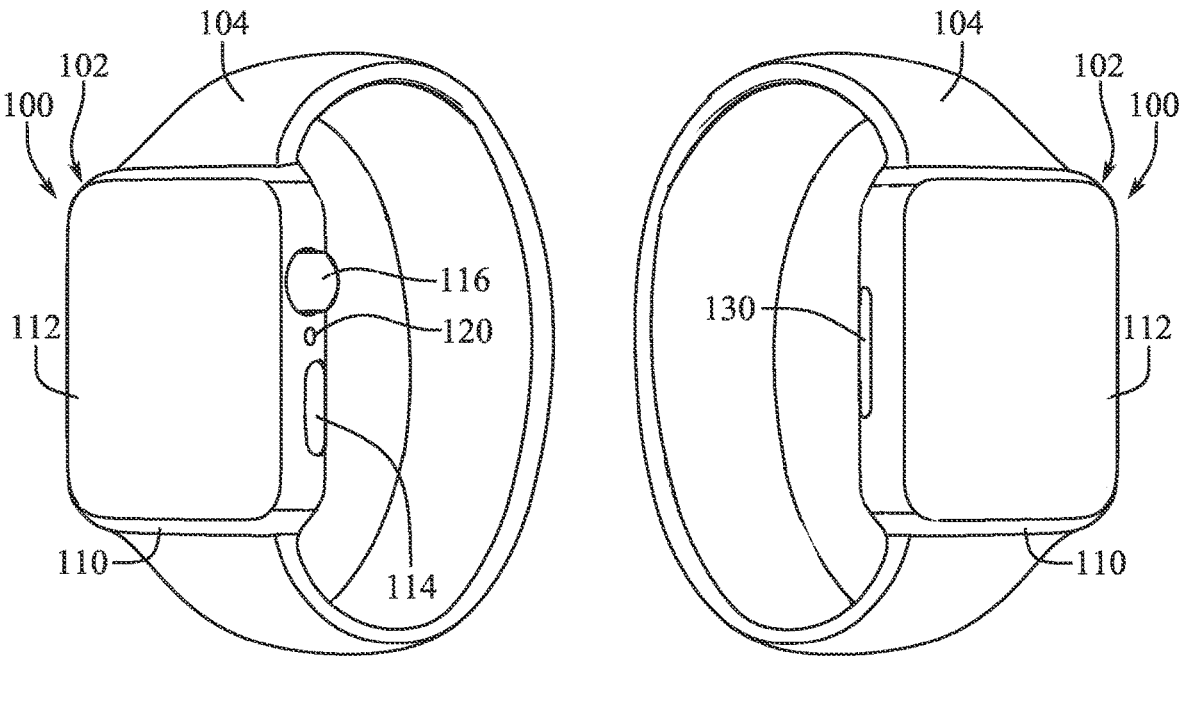
FIG. 2        FIG. 3
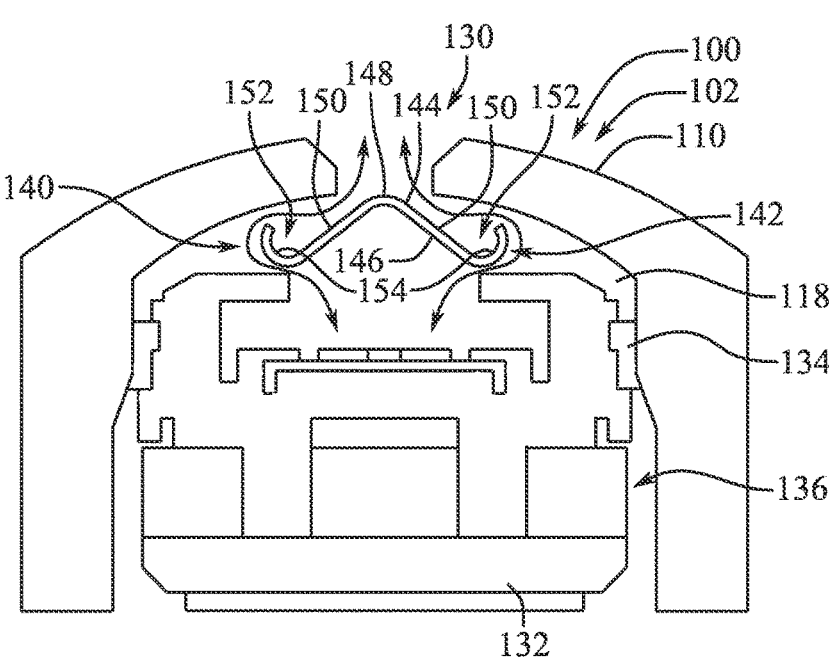
FIG. 4

FLUID DEFLECTOR FOR ELECTRONIC DEVICES

CROSS-REFERENCE TO RELATED APPLICATION(S)

This claims priority to U.S. Provisional Patent Application No. 63/374,736, filed 6 Sep. 2022, and entitled "FLUID DEFLECTOR FOR ELECTRONIC DEVICES," the entire disclosure of which is hereby incorporated by reference.

FIELD

The described embodiments relate generally to portable electronic device. More particularly, the present embodiments relate to water deflectors that can be incorporated into one or more electronic devices.

BACKGROUND

Electronic devices are increasingly being designed with device portability in mind, for example, to allow users to use these devices in a wide variety of situations and environments. In the context of wearable devices, these devices can be designed to include many different functionalities and to be operated in many different locations and environments. The components of an electronic device, for example, the processors, memory, antennas, display, and other components can partially determine a level of performance of the electronic device. Further, the arrangement of these components with respect to one another in the device can also determine the level of performance of the electronic device.

SUMMARY

In at least one example, a portable electronic device includes a housing, an internal volume within the housing, a port having a perimeter defined by the housing, the port in fluid communication with the internal volume and an external environment, and a water deflector disposed inside the housing adjacent to the port. The water deflector can extend at least a length and a width of the port, and the water deflector can include openings defined by the water deflector. The openings defined by the water deflector can be aligned outside of the perimeter of the port.

In one example, the water deflector of the portable electronic device can be coupled to the housing. In one example, a perimeter of the water deflector of the portable electronic device is coupled to the housing. In one example, the water deflector of the portable electronic device is coupled to an electronic component disposed within the internal volume of the portable electronic device. In one example, the water deflector of the portable electronic device includes a deflector surface with a peak and a curved surface adjacent to the peak has an edge that curves back toward the port. In one example, the portable electronic device has a first port and a second port defined by the housing, and a water deflector disposed inside the housing and near the second port, with the first port being a speaker port and the second port being a microphone port.

In at least one example, a fluid deflector includes a body sized to extend at least a length and a width of a port of a housing of an electronic device, and an opening disposed in the body, the opening allows air to pass through or around the fluid deflector and reduce an amount of energy of the incoming fluid entering the port. The body forms a peak, the peak can extend toward the port. The body comprises a deflector surface that has an edge that curves back toward the peak.

In one example, the peak of the fluid deflector is centered in a width direction of the port. In one example, the peak of the fluid deflector extends at least the length of the port. In one example, the opening comprises a pair of lateral openings, each lateral opening is disposed on an opposite lateral end of the peak. In one example, the body of the fluid deflector is connected to the housing. In one example, the opening in the body of the fluid deflector includes a plurality of non-circular openings. In one example, the body of the fluid deflector includes a port-facing side and an internal-facing side, with the internal-facing side of the body including a hydrophobic coating. In one example, the port-facing side of the body of the fluid deflector includes a hydrophilic coating.

In at least one example, a portable electronic device includes a housing defining an internal volume, a port defined by the housing, the port having a body including a length and a width and the port in fluid communication with the internal volume and an external environment, a water deflector sized to extend at least the length and the width, and an opening defined by the water deflector, the opening configured to allow air to pass. The body defines a peak, the peak extending toward the port and the water deflector is connected to an electronic component disposed within the internal volume.

In one example, the peak includes a first peak and the body further defines a second peak and a valley disposed between the first peak and the second peak. In one example, the port defines a perimeter and the opening is outside the perimeter. In one example, the opening comprises a first opening and a second opening. In one example, the first opening is disposed on a first side of the peak and the second opening is disposed on a second side of the peak. In one example, the opening defines a tapered cross-section.

BRIEF DESCRIPTION OF THE DRAWINGS

The disclosure will be readily understood by the following detailed description in conjunction with the accompanying drawings, wherein like reference numerals designate like structural elements, and in which:

FIG. 2 illustrates a right side perspective view of a portable electronic device, in accordance with some embodiments.

FIG. 3 illustrates a left side perspective view of the portable electronic device of FIG. 2.

FIG. 4 illustrates an exemplary partial cross-sectional view of a speaker port of a portable electronic device with a fluid deflector, in accordance with some embodiments.

DETAILED DESCRIPTION

Figure 1:
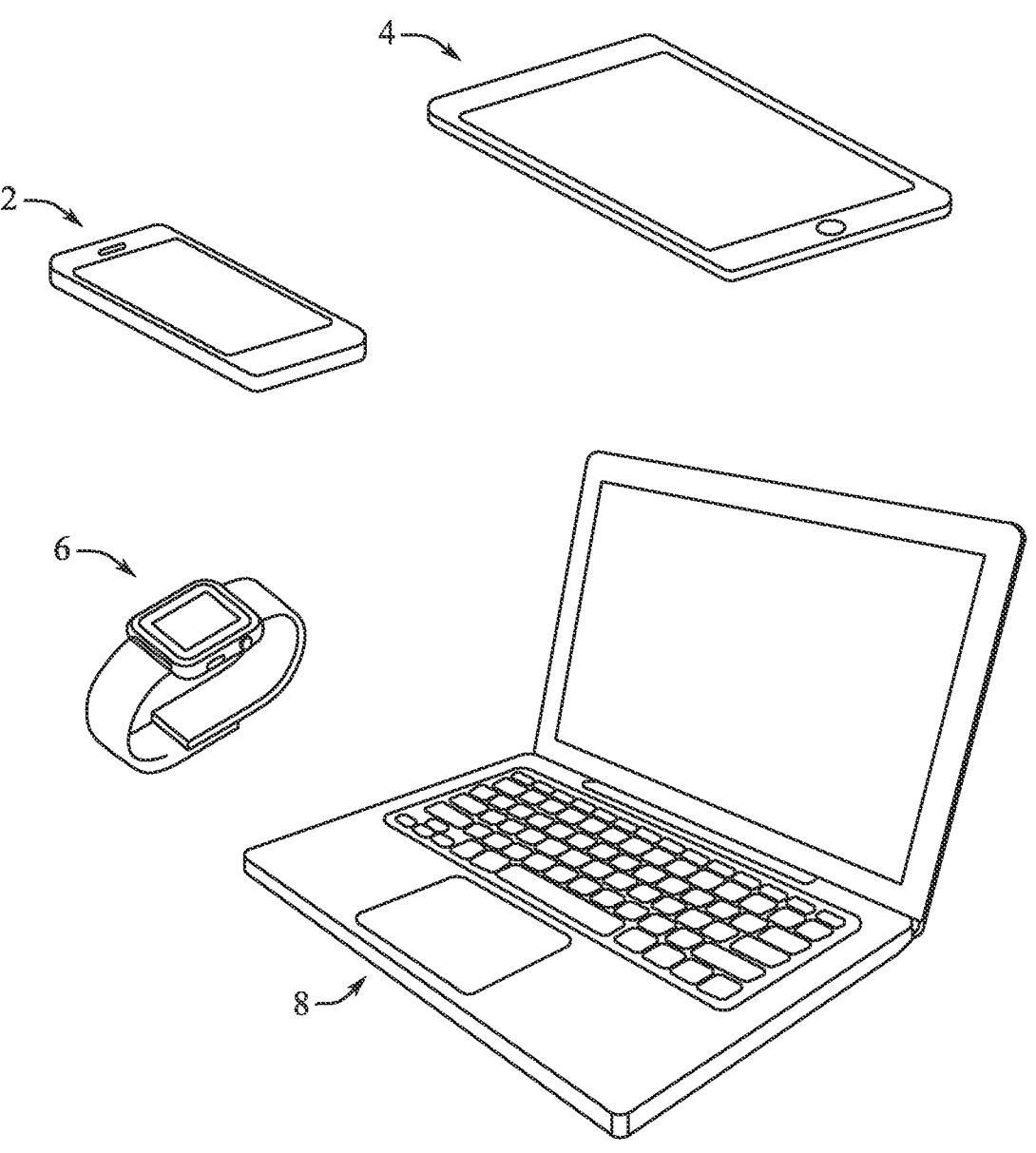
FIG. 1 illustrates perspective views of various electronic devices that can utilize a fluid deflector described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The present disclosure relates generally to electronic devices. More particularly, the present disclosure relates to fluid or water deflectors that are used to defect or reduce the amount of energy of incoming water entering a port of a portable electronic device. In some examples, the electronic device can be portable and can include a housing that defines an internal volume. The internal volume of the housing can contain electronic components. The housing of the electronic device can include ports that are in fluid communication between the internal volume and an external environment. For example, audio ports, such as microphone ports or speaker ports, allow fluid communication between the internal volume and the external environment so that air can pass into the internal volume via the audio port from the external environment. However, fluid communication between the internal volume and the exterior environment also enables water to pass through the ports and potentially damage the electronic components disposed within the housing of the electronic device.

The electronic device can be designed to survive high static water pressure without damaging the electronic components disposed within the housing. For example, the electronic device can be able to withstand being submersed in water up to 50 meters. However, in some situations, fluid, such as water, entering the ports at high velocities can potentially impact the electronic components disposed within the housing. For example, activities such as falling off of a moving water craft (e.g. Jet Ski, motor boat, etc.), entering the water at a high velocity (e.g., diving), or even high cycle repeated actions (e.g., swimming strokes) can impact the internal electronic components.

The electronic device can include a fluid or water deflector that deflects or reduces the amount of energy of incoming water entering the ports of the housing of the electronic device to prevent the high energy incoming water from directly engaging the internal electronic components, thereby reducing the impact to the internal electronic components.

These and other embodiments are discussed below with reference to FIGS. 1-18. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1 illustrates various portable electronic devices that can utilize a fluid or water deflector, including a smartphone 2, a tablet computer 4, a smartwatch 6, and a portable computer 8. Further, the portable electronic device can correspond to any form of wearable electronic device, a portable media player, a media storage device, a portable digital assistant ("PDA"), a mobile communication device, a GPS unit, a remote control device, or other electronic device. The electronic device can be an electronic device or a consumer device.

FIGS. 2 and 3 illustrate an example of an electronic device 100. FIG. 2 illustrates a right side perspective view of the electronic device 100 and FIG. 3 illustrates a left side perspective view of the electronic device 100. The electronic device shown in FIGS. 2 and 3 is a watch, such as a smartwatch. The smartwatch of FIG. 2 is merely a representative example of an electronic device that can be used in conjunction with the systems and methods disclosed herein. The electronic device 100 can include a body 102 that can carry operational components in an internal volume of the body 102 at least partially defined by a housing 110 of the body 102. The electronic device 100 can also include a strap 104, or another retaining component, that can secure the electronic device 100 to the body of a user, as desired.

The body 102 of the electronic device 100 can include a housing 110 and a cover 112 attached to the housing 110. The housing 110 can substantially define at least a portion of an exterior surface of the electronic device 100. The cover 112 can include a ceramic material such as sapphire, glass, plastic, or any other substantially transparent materials, component, or assembly. The cover 112 can cover or otherwise overlay a display, a camera, a touch sensitive surface such as a touchscreen, or other component of the electronic device 100. The cover 112 can define a front exterior surface of the electronic device 100. Together, the housing 110 and the cover 112 can substantially define the exterior surface of the electronic device 100.

The housing 110 can be a substantially continuous or unitary component. The housing 110 can include input components, such as one or more buttons 114 and/or a crown 116. A user can use the button 114 and the crown 116 to provide inputs and instructions to the electronic device 100.

The housing 110 can further include and/or define a plurality of ports that are in fluid communication with both the external or ambient environment and the internal volume of the electronic device 100. For example, the housing 110 can have a plurality of audio ports (e.g., microphone port, speaker port, etc.). The ports can be referred as a first port and a second port. In the illustrated embodiment of FIG. 2, the housing 110 includes a microphone port 120 that is disposed between the button 114 and the crown 116. A microphone can be disposed in the internal volume such that it is in fluid communication with the external or ambient environment through the microphone port 120. In the illustrated embodiment, the microphone port 120 has a circular shape. However, the microphone port 120 can have a variety of different shapes and sizes.

In the illustrated embodiment of FIG. 3, the housing includes a speaker port 130. The speaker port 130 is a slot disposed on the left side of the housing 110. The speaker port 130 has a predetermined length and width. However, the speaker port 130 can have a variety of different shapes and sizes. A speaker can be disposed in the internal volume such that it is in fluid communication with the external or ambient environment through the speaker port 130.

FIG. 4 illustrates a partial schematic cross-sectional view of the housing 110 of the electronic device 100, the speaker port 130, and a portion of an internal volume 118 of the housing 110. The illustrated portion of the internal volume 118 of the housing 110 contains various electronic components 136, such as a speaker 132. A seal 134 can be disposed along an inner surface of the housing 110 between some of electronic components 136 and the internal volume 118. The seal 134 can provide a fluid tight seal to prevent passage of fluid through the seal 134.

In addition, a fluid or water deflector 140 is disposed inside the housing adjacent to the speaker port 130. As discussed above, the water deflector 140 deflects or reduces the amount of kinetic energy of incoming fluid (e.g., water) entering the speaker port 130. For ease of illustration and description, only the cross-sectional view of the speaker port 130 is provided. However, the water deflector 140 can be implemented in any of the ports of the housing 110, specifically in any of the audio ports, such as the microphone port 120.

The water deflector 140 is configured allow air to pass through or around the water deflector 140 to allow air to enter the internal volume 118 where the speaker 132 is located. The air can pass in both directions, as illustrated by the arrows. Certain audio ports, such as the microphone port 120 and the speaker port 130 utilize air from the external environment to function. In the illustrated embodiment, the water deflector 140 blocks a direct line of sight from the speaker port 130 and the internal volume 118 of the housing 110. Accordingly, the air follows a torturous path to enter and exit the internal volume 118 of the housing 110. In some embodiments, the water deflector 140 can include a plurality of openings (not shown) that allow air to enter and exit the internal volume 118 of the housing 110. The plurality of openings can be aligned outside a perimeter of the speaker port 130 or outside a line of sight of the speaker port 130. In some embodiments, the plurality of openings are outside a direct line of sight of the speaker port 130.

The water deflector 140 includes a body 142 sized to extend at least a length and a width of the speaker port 130 of the housing 110. The body 142 has a port-facing side 144 and an internal-facing side 146 with the port-facing side 144 facing the speaker port 130 and the internal-facing side 146 facing the electronic components 136 disposed within the internal volume 118 of the housing 110. The body 142 can form a peak 148 including opposing sides 150 that extend toward the speaker port 130. The peak 148 can be centered in a width direction of the speaker port 130. In the illustrated embodiment, the width direction of the speaker port 130 is the illustrated lateral direction.

The water deflector 140 can further include a deflector surface 152 to deflect incoming water back toward the peak 148 and the speaker port 130. In the illustrated embodiment, each lateral side of the body 142 includes a deflector surface 152. The deflector surface 152 includes one of the opposing sides 150 the forms the peak 148 and a curved surface 154 that curves or arcs from a base of the peak 148 back toward the peak 148 and/or the speaker port 130. In other words, edges of the deflector surface 152 curve back toward the peak 148 and/or speaker port 130.

In some embodiments, the water deflector 140 can be mounted directly to the housing 110. In some examples, the water deflector 140 can be mounted directed to electronic components disposed within the internal volume 118 of the housing 110.

Figures 5, 6, 7:
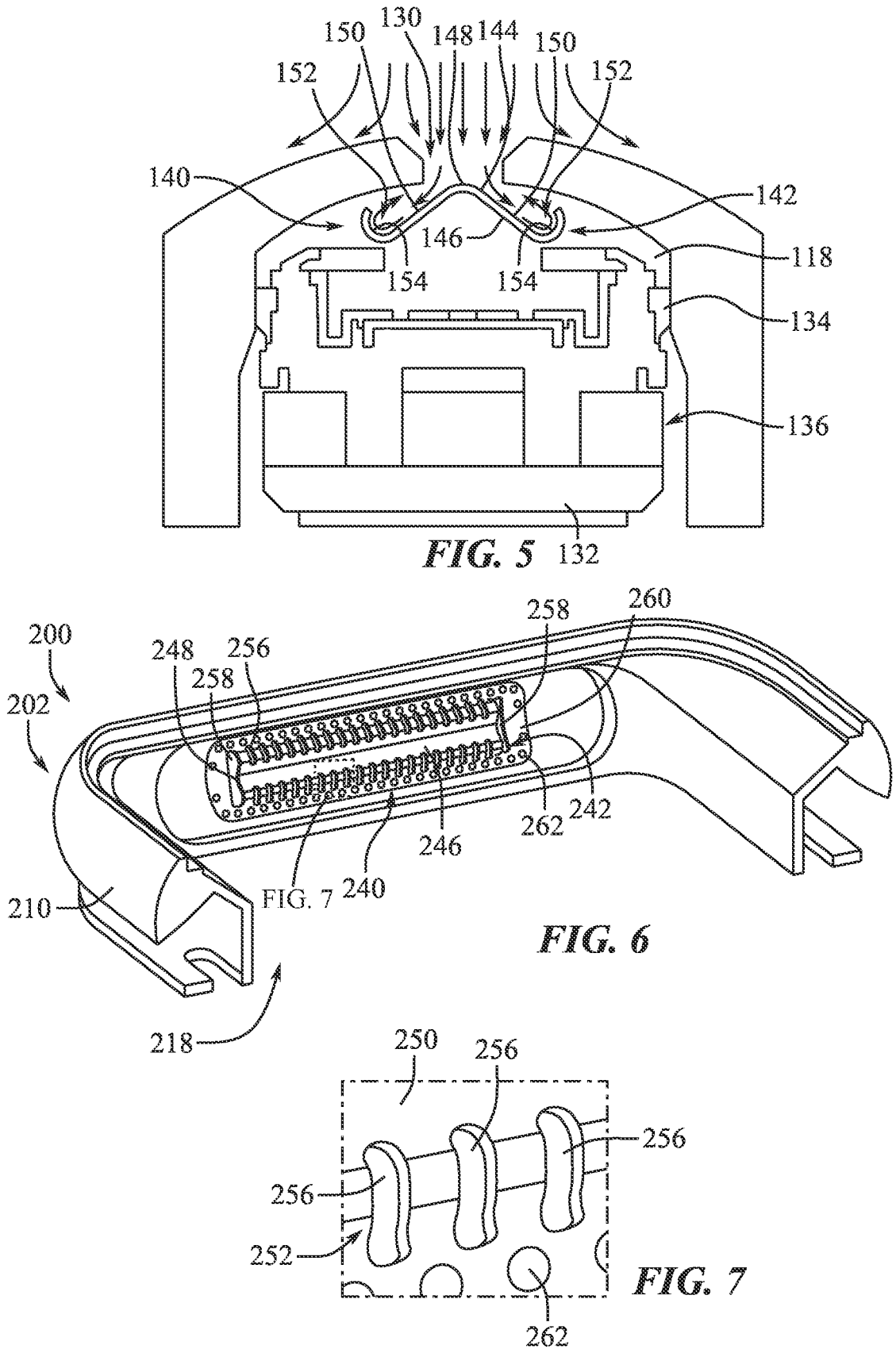
FIG. 5 illustrates an exemplary partial cross-sectional view of the speaker port of FIG. 4 with water entering the speaker port.
FIG. 6 illustrates a partial internal perspective view of an electronic device and a fluid deflector, in accordance with some embodiments.
FIG. 7 illustrates a detailed view of a plurality of openings in the fluid deflector of FIG. 6.

FIG. 5 illustrates a schematic partial cross-sectional view of the housing 110 of the electronic device 100, the speaker port 130, and the internal volume 118 of the housing 110 when high velocity water is entering the speaker port 130. In this situation, the incoming water, illustrated by the arrows, is deflected by the water deflector 140 which reduces the amount of kinetic energy of the incoming water entering the speaker port 130. In other words, the incoming water directly engages the water deflector 140 which changes the direction of the incoming water. The water deflector 140 can be designed to direct the incoming water back into itself. For example, in the illustrated embodiment, the kinetic energy of the incoming water is redirected into itself by the pair of deflector surfaces 152, thus creating eddy currents or turbulence and reducing the kinetic energy of the water. Accordingly, incoming water with a high kinetic energy does not directly engage the electronic components 136 in the internal volume 118 of the housing 110.

While the incoming water can eventually follow the tortuous path (similar to the tortuous path followed by air) to enter the internal volume 118 of the housing 110, the electronic components are already designed to withstand high static water pressure. In addition, the electronic device 100 can include a feature to expel the water disposed within the internal volume 118 of the housing 110 out of the speaker port 130.

In some examples, the water deflector 140 can include coatings. For example, the internal-facing side 146 of the body 142 of the water deflector 140 can have a hydrophobic coating that repels water. The port-facing side 144 of the body 142 of the water deflector 140 can have a hydrophilic coating that attracts water. Accordingly, the coatings of the water deflector 140 can create flow pathway for the water to exit the internal volume 118 of housing 110. The flow pathway transitions from hydrophobic to hydrophilic to transition the water out of the internal volume 118 of the housing 110. The coatings can work in tandem with the feature that expels water disposed within the internal volume 118 of the housing 110 out of the speaker port 130.

FIGS. 6-9 depict an embodiment of an electronic device 200 that resembles the electronic device 100 described above in certain respects. Accordingly, like features are designated with like reference numerals, with the leading digits incremented to "2." For example, the embodiment depicted in FIG. 6 includes a water deflector 240 that can, in some respects, resemble the water deflector 140 of FIGS. 4 and 5. Relevant disclosure set forth above regarding similarly identified features thus may not be repeated hereafter. Moreover, specific features of the electronic device 100 and related components shown in FIGS. 1-5 may not be shown or identified by a reference numeral in the drawings or specifically discussed in the written description that follows. However, such features can clearly be the same, or substantially the same, as features depicted in other embodiments and/or described with respect to such embodiments. Accordingly, the relevant descriptions of such features apply equally to the features of the electronic device 200 and related components depicted in FIGS. 6-9. Any suitable combination of the features, and variations of the same, described with respect to the electronic device 100 and related components illustrated in FIGS. 1-5 can be employed with the electronic device 200 and related components of FIGS. 6-9, and vice versa. This pattern of disclosure applies equally to further embodiments depicted in subsequent figures and described hereafter, wherein the leading digits can be further incremented.

Figures 8, 9:
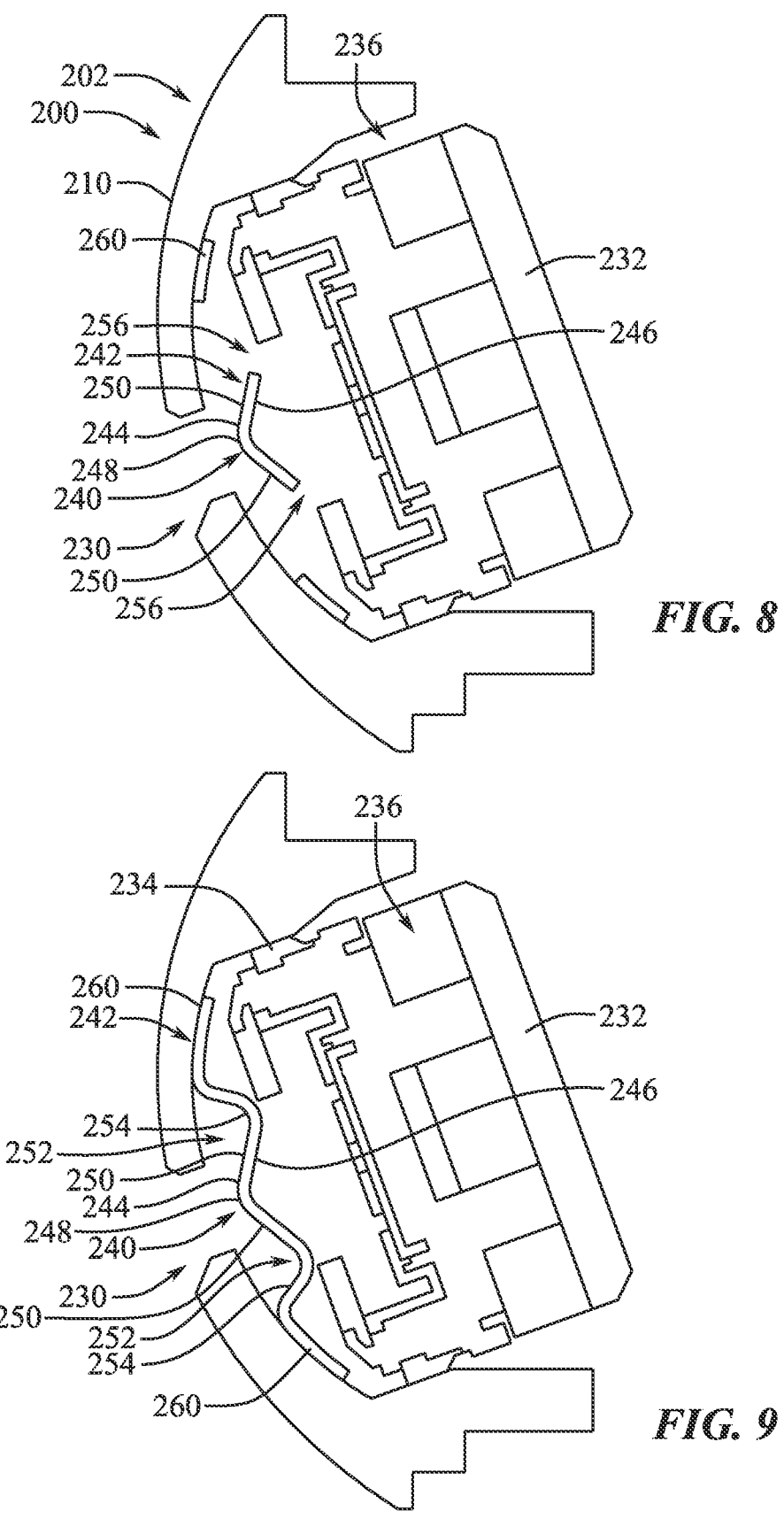
FIG. 8 illustrates a first partial cross-sectional view of the electronic device and the fluid deflector of FIG. 6
FIG. 9 illustrates a second partial cross-sectional view of the electronic device and the fluid deflector of FIG. 6.

FIGS. 6-9 illustrate an exemplary embodiment of the electronic device 200. FIG. 6 is a partial internal perspective view. FIG. 7 is a detailed view of the water deflector 240. FIG. 8 is a first partial cross-sectional view of the electronic device 200. FIG. 9 is a second partial cross-sectional view of the electronic device 200. The electronic device 200 includes a body 202 which includes a housing 210. The body 202 that can carry operational components, for example, in an internal volume 218 at least partially defined by the housing 210 of the body 202.

The housing 210 can further include and/or define a plurality of ports that are in fluid communication with the external or ambient environment and the internal volume 218 of the electronic device 200. A seal 234 can be disposed along an inner surface of the housing 210 between some of electronic components 236 and the internal volume 218. In the illustrated embodiment, the housing 210 has a speaker port 230 (see FIGS. 8 and 9). The speaker port 230 is a slot disposed on the left side of the housing 210. The speaker port 230 has a predetermined length and width. However, the speaker port 230 can have a variety of different shapes and sizes. A speaker 232 (see FIGS. 8 and 9) is disposed in the internal volume 218 such that is in communication with the external or ambient environment through the speaker port 230.

The water deflector 240 is disposed inside the housing 210 adjacent to the speaker port 230. The water deflector 240 is configured to deflect or reduce the amount of kinetic energy of incoming water entering the speaker port 230. The water deflector 240 is configured allow air to pass through or around the water deflector 240 to allow air to enter the internal volume 218. In the illustrated embodiment, the water deflector 240 blocks a direct line of sight from the speaker port 230 and the internal volume 218 of the housing 210. In the illustrated embodiment of FIG. 6, the partial internal perspective view does not illustrate the speaker port 230 because the speaker port 230 is completely blocked from view by the water deflector 240.

The water deflector 240 includes a body 242 sized to at least a length and a width of the speaker port 230 of the housing 210. The body 242 has a port-facing side 244 and an internal-facing side 246 with the port-facing side 244 facing the speaker port 230 and the internal-facing side 246 facing the electronic components 236 (e.g. the speaker 232) disposed within the internal volume 218 of the housing 210. The body 242 can form a peak 248 including opposing sides 250 that extend toward the speaker port 230. The peak 248 can be centered in a width direction of the speaker port 230.

The water deflector 240 can further include a deflector surface 252 to deflect incoming water back toward the peak

248 and the speaker port 230. As clearly illustrated the cross-sectional view of FIG. 9, each lateral side of the body 242 includes the deflector surface 252. The deflector surfaces 252 includes one of the opposing sides 250 that forms the peak 248 and a curved surface 254 that curves or arcs from a base of the peak 248 toward the peak 248 and/or the speaker port 230. In other words, edges of the deflector surface 252 curve back toward the peak 248 and/or the speaker port 230. Incoming water that enters the speaker port 230 is deflected by the water deflector 240 which reduces the amount of kinetic energy of the incoming water entering the speaker port 230. In other words, the incoming water directly engages the peak 248 or the opposing sides 250 of the water deflector 240 which changes the direction of the incoming water. In the illustrated embodiment, the incoming water can follow the opposing sides 250 to the pair of deflector surfaces 252 which redirect the water back toward the peak 248 and the speaker port 230 as the water curves on the curved surfaces 254. When the incoming water is redirected back toward the peak 248 and the speaker port 230, the incoming water and the redirected water engage, thus creating eddy currents or turbulence and reducing the kinetic energy of the water. Accordingly, the incoming water with a high kinetic energy does not directly engage the electronic components 236 in the internal volume 218 of the housing 210.

In the illustrated embodiment, the water deflector 240 can define a plurality of openings 256 that allow air to enter and exit the internal volume 218 of the housing 210. The plurality of openings extend through the body 242 of the water deflector 240. In the illustrated embodiment of FIG. 6, the plurality of openings 256 are partially disposed one of the opposing sides 250, the curved surface 254 of the body 242.

FIG. 7 illustrates a detailed view of a few of the plurality of openings 256. In the illustrated embodiment, the plurality of openings 256 have a curved or lozenge shape. However, the present disclosure is not so limited, and the plurality of openings 256 can have a variety of different shapes, such as circular, semi-circular, triangular, pentagram, rectangular, parallelogram, rhombus, trapezium, kite, a variety of differently shaped polygons, and the like. The plurality of openings 256 allow for fluid communication between the external environment and the internal volume 218 where the electronic components 236 are disposed. In other words, air and water can pass through the plurality of openings 256. The shape of the plurality of openings 256 can further disrupt or reduce the kinetic energy as it passes through the plurality of openings 256. Specifically, non-circular openings with distinct edges further reduce the kinetic energy of the incoming water.

FIG. 8 illustrates a first cross-sectional view of the electronic device 200, specifically the water deflector 240 that is taken along one of the plurality of openings 256 on the opposing sides 250 of the water deflector 240. FIG. 9 illustrates a second cross-sectional view of the electronic device 200, specifically the water deflector 240 that is taken along the water deflector 240 but not along the plurality of openings 256. As illustrated in FIG. 8, the plurality of openings 256 are aligned outside a perimeter of the speaker port 230 or outside a line of sight of the speaker port 230. In some embodiments, the plurality of openings 256 are merely outside a direct line of sight of the speaker port 230. A direct line of sight is a line of sight that is perpendicular to the speaker port 230. Due to the location of the plurality of openings 256 on the water deflector 240, fluid (e.g., air or water) follows a torturous or multi-curved path to enter and exit the internal volume 218 of the housing 210.

The water deflector 240 can further include a pair of lateral openings 258 (shown in FIG. 6). The lateral openings 258 can be disposed on opposing lateral sides of the water deflector 240. The lateral openings 258 are aligned outside the perimeter of the speaker port 230 or outside a line of sight of speaker port 230. The lateral openings 258 help provide additional fluid communication between the external environment and the internal volume 218. Since the lateral openings 258 are not in a line of sight of the speaker port 230, they also help provide a tortuous path for the fluid communication between the external environment and the internal volume 218, thereby dissipating kinetic energy from the fluid as it passes.

In the illustrated embodiment of FIG. 6, the water deflector 240 is mounted directly to the housing 210. The water deflector 240 can be mounted in a number of different ways, such as welding, screws, fasteners, or snap fitted. A perimeter 260 of the water deflector 240 can be laser welded to the housing 210 with a plurality of weld spots 262.

Figure 10:
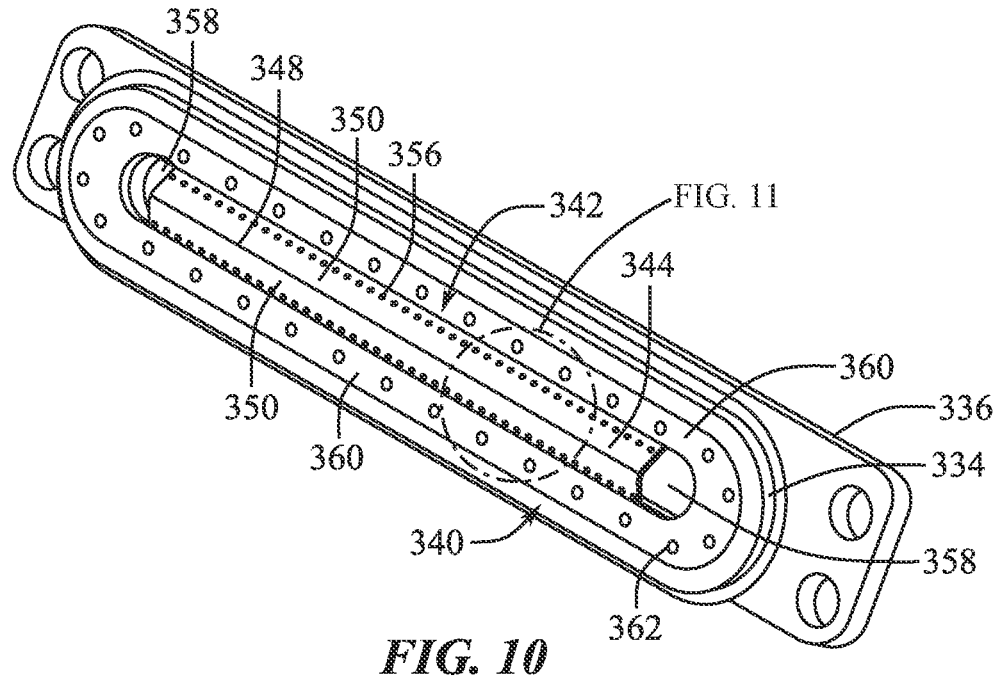
FIG. 10 illustrates a perspective view of a fluid deflector, in accordance with some embodiments.
Figure 11:
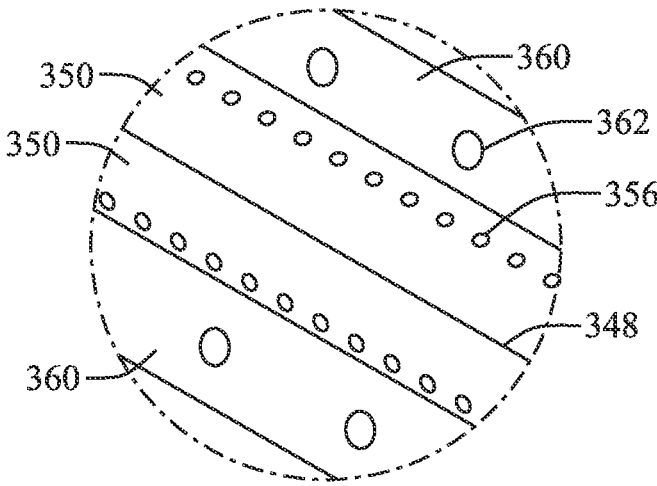
FIG. 11 illustrates a detailed view of the fluid deflector of FIG. 10.
Figures 12, 13, 14:
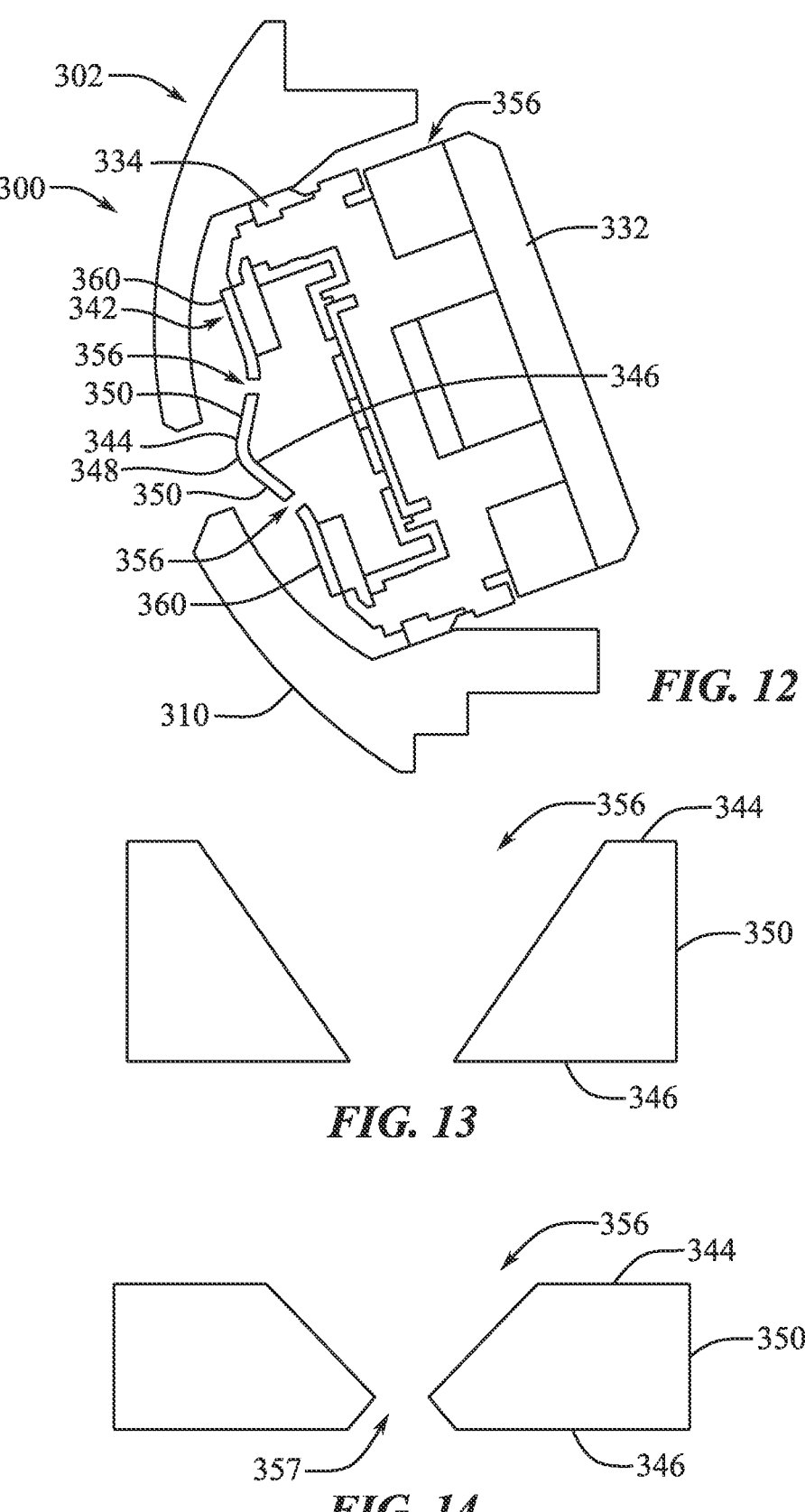
FIG. 12 illustrates a partial cross-sectional view of an electronic device and the fluid deflector of FIG. 10 disposed within the electronic device, in accordance with some embodiments.
FIG. 13 illustrates a cross-sectional view of an opening in a fluid deflector, in accordance with to some embodiments.
FIG. 14 illustrates a cross-sectional view of an opening in a fluid deflector, in accordance with to some embodiments.

FIGS. 10-14 illustrate an exemplary embodiment of the electronic device 300. FIG. 10 illustrates a detailed view of a water deflector 340. FIG. 11 illustrates a detailed view of a plurality of openings 356 of the water deflector 340. FIG. 12 illustrates a partial cross-sectional view of the electronic device 300 with the water deflector 340 deposed within an internal volume 318 of electronic device 300. FIGS. 13 and 14 are cross-sectional views of different embodiments of the plurality of openings in the water deflector 340. Further details of the exemplary embodiment of the electronic device 300 will be provided below with reference to FIGS. 10-14.

The electronic device 300 includes a body 302 which includes a housing 310 as seen in FIG. 12. The body 302 can carry operational components, for example, in the internal volume 318 at least partially defined by the housing 310 of the body 302.

FIG. 10 illustrates a detailed view of the water deflector 340 disposed adjacent to the speaker port 330. The water deflector 340 includes a body 342 sized to extend at least a length and a width of the speaker port 330 of the housing 310. The body 342 has a port-facing side 344 and an internal-facing side 346, with the port-facing side 344 facing the speaker port 330, and the internal-facing side 346 facing the electronic components (e.g., a speaker 332) disposed within the internal volume 318 of the housing 310. The body 342 can form a peak 348 including opposing sides 350 that extend toward the speaker port 330. The peak 348 can be centered in a width direction of the speaker port 330, as seen in FIG. 12. The opposing side 350 extends downward from the peak 348 and transitions into a perimeter 360 of the water deflector 340.

In some examples, the water deflector 340 can be coupled directly to electronic components 336 that are configured to be disposed in the internal volume 318 of the housing 310. The water deflector 340 can be mounted in a number of different ways, such as welding, screws, fasteners, or snap fitted. The perimeter 360 of the water deflector 340 can be laser welded to the electronic components 336 with a plurality of weld spots 362. The electronic components 336 can include a seal 334, similar to the seal 134 of FIGS. 4 and 5.

The water deflector 340 can further include a pair of lateral openings 358. The lateral openings 358 can be disposed on opposing lateral sides of the water deflector 240. The lateral openings 358 are configured to be aligned outside a perimeter of the speaker port 330 or outside a line of sight of speaker port 330. The lateral openings 358 help provide additional fluid communication between the external environment and the internal volume 318. Since the lateral openings 358 are aligned outside the perimeter of the speaker port 330, they also help provide a tortuous path for the fluid communication between the external environment and the internal volume 318.

In the illustrated embodiment, the water deflector 340 can include a plurality of openings 356 that allow air to enter and exit the internal volume 318 of the housing 310. The plurality of openings extend through the body 342 of the water deflector 340. In the illustrated embodiment of FIG. 10, the plurality of openings 356 are disposed one of the opposing sides 350 of the peak 348.

FIG. 11 illustrates a detailed view of a few of the plurality of openings 356. In the illustrated embodiment, the plurality of openings 356 have a circular shape. However, the present disclosure is not so limited, and the plurality of openings 356 can have a variety of different shapes, such as, semi-circle, triangular, pentagram, rectangular, parallelogram, rhombus, trapezium, kite, a variety of differently shaped polygons, curves, non-linear geometries, lozenges, and the like. The plurality of openings 356 allows for fluid communication between the external environment and the internal volume 318 where the electronic components are disposed. In other words, air and water can pass through the plurality of openings 356.

The plurality of openings 356 can have a variety of different cross-sections. For example, FIG. 12 illustrates a partial cross-section view electronic device 300 that is taken along one of the plurality of openings 356 on opposing sides 350 of the water deflector 340. The cross-section of the plurality of openings 356 have parallel sides that extends from the port-facing side 344 to the internal-facing side 346 of the water deflector 340.

In some embodiments, the plurality of openings 356 can have a different cross-section. FIG. 13 illustrates an exemplary cross-section of the plurality of openings 356. The opening 356 is illustrated as having a tapered shape. In other words, the diameter of the opening 356 decreases as the opening extends from the port-facing side 344 to the internal-facing side 346 of the water deflector. This cross-sectional shape of the opening 356 helps reduce the kinetic energy of the incoming water as any incoming water is directed inward, causing turbulence and a loss of kinetic energy.

FIG. 14 illustrates another exemplary cross-section of the plurality of openings 356. The opening 356 can have a tapered shape that tapers inward and then tapers outward. More specifically, as illustrated in the example of FIG. 14, the diameter of the opening decreases as the opening 356 extends from the port-facing side 344 to the internal-facing side 346 for a predetermined depth, and then increases until it reaches the internal-facing side 346. The transition from the decreasing diameter to the increasing diameter can create a bottleneck 357 that helps reduce the kinetic energy of the incoming water, while providing an expanding geometry for water directed out toward the port.

As discussed above, FIG. 12 illustrates a cross-sectional view of the electronic device 300. The water deflector 340 is disposed within the housing 310 adjacent to the speaker port 330. The water deflector 340 is configured to deflect or reduce the amount of kinetic energy of incoming water entering the speaker port 330. The water deflector 340 is configured allow air to pass through or around the water deflector 340 to allow air to enter the internal volume 318.

The speaker port 330 has a predetermined length and width, and the water deflector 340 has a length and depth that is at least the length and width of the speaker port 330.

According to the example illustrated in FIG. 12, the water deflector 340 is coupled directly to the electronic component 336. In the illustrated embodiment, the electronic component 336 is coupled to the speaker 332. A seal 334 seals the electronic component 336 to the housing 310 to prevent fluid (e.g., water and air) from reaching the speaker 332 around the sides of the water deflector 340.

In addition, the plurality of openings 356 are outside a line of sight of the speaker port 330. In some embodiments, the plurality of openings 356 are merely located outside the perimeter of the port. For example, a direct line of sight can be defined as a line of sight that is taken from a viewing perspective located perpendicular to the speaker port 330. Due to the location of the plurality of openings 356 on the water deflector 340, there is no direct line of ingress that leads to the speaker. Consequently, any fluid (e.g., air or water) entering the speaker port 330 follows a torturous path to enter and exit the internal volume 318 of the housing 310. Further, because the plurality of openings 356 are disposed on opposing sides 350, the location of the plurality of openings 356 add to the tortuous path. The angle of the opposing sides 350 can also be increased or decreased so that the opposing sides 350 can better deflect the incoming water.

Figure 15:
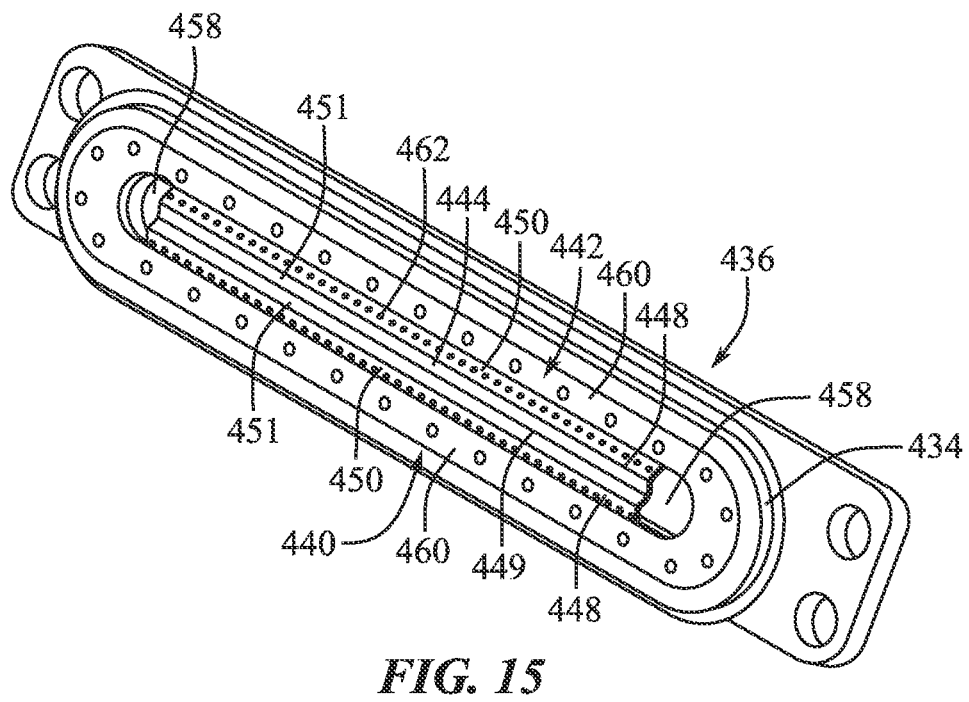
FIG. 15 illustrates a perspective view of a water deflector, in accordance with some embodiments.
Figure 16:
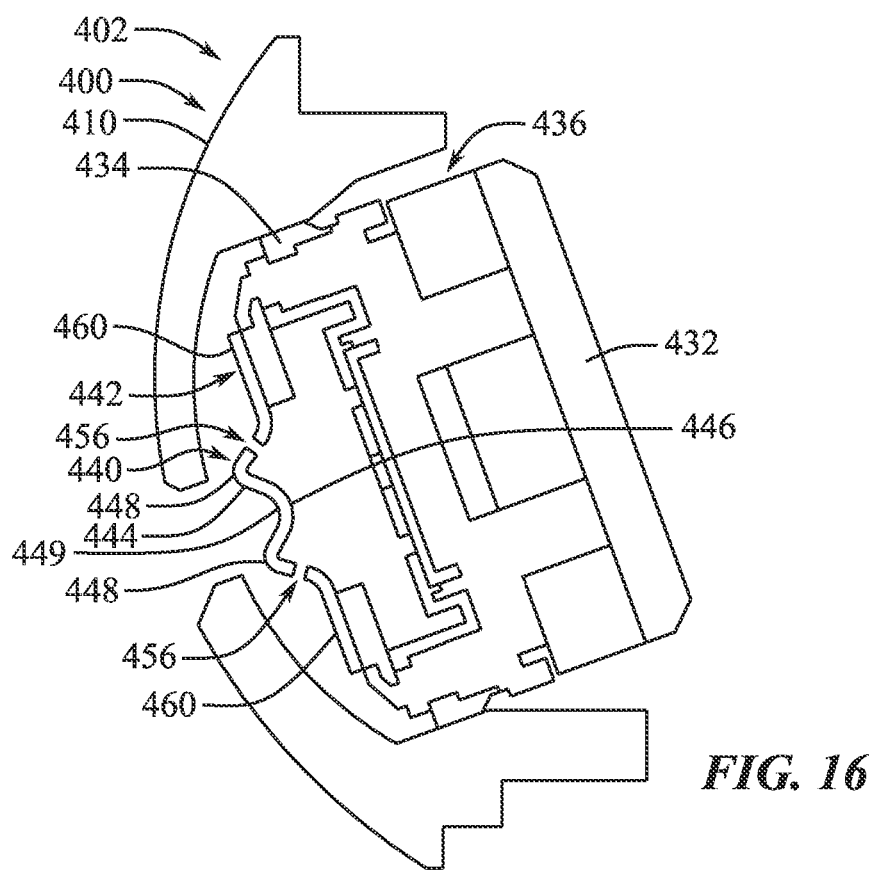
FIG. 16 illustrates a partial cross-sectional view of an electronic device and the fluid deflector of FIG. 15 disposed within the electronic device, in accordance with some embodiments.

FIGS. 15 and 16 illustrate an exemplary embodiment of the electronic device 400. FIG. 15 illustrates a detailed view of a water deflector 440, and FIG. 16 illustrates a cross-sectional view of the electronic device 400 with the water deflector 440 deposed within an internal volume 418 of electronic device 400.

The electronic device 400 includes a body 402 which includes a housing 410, as seen in FIG. 16. The body 402 that can carry operational components, for example, in the internal volume 418 is at least partially defined by the housing 410 of the body 402. A seal 434 can be disposed along an inner surface of the housing 410 between some of electronic components 436 and the internal volume 418.

FIG. 15 illustrates a detailed view of the water deflector 440. The water deflector 440 includes a body 442 sized to extend at least a length and a width of the speaker port 430 defined by the housing 410. The body 442 has a port-facing side 444 and an internal-facing side 446, with the port-facing side 444 facing the speaker port 430 and the internal-facing side 446 facing the electronic components 436 (e.g., the speaker 432) disposed within the internal volume 418 of the housing 410. The body 442 can form dual peaks 448 with a valley 449 disposed between the dual peaks 448. Each peak 448 including an outer side 450 and an inner side 451. The peaks 448 extend toward the speaker port 430 with the valley 449 centered in a width direction of the speaker port 430, as seen in FIG. 16. The outer sides 450 extend downward from the peaks 448 and transition into a perimeter 460 of the water deflector 440. The water deflector 440 can, according to some examples, be coupled directly to electronic components 436 that are configured to be disposed in the internal volume 418 of the housing 410. For example, the perimeter 460 of the water deflector 440 can be laser welded to the housing 410 with a plurality of weld spots 462.

The valley 449 can act similar to the deflector surface 152, 252 described above in reference to FIGS. 4-9. Incoming water that enters the speaker port 430 is deflected by the valley 449 which reduces the amount of kinetic energy of the incoming water entering the speaker port 430. In other words, the incoming water directly engages the peaks 448, valley 449, or the outer sides 450 of the water deflector 440, which changes the direction of the incoming water. In the illustrated embodiment, the incoming water can follow the inner sides 451 to the depth of the valley where it encounters incoming water coming down the opposing inner sides 451, or is curved back toward the speaker port 430. Accordingly, the incoming water on opposing inner sides 451 collide thus creating eddy currents or turbulence and reducing the kinetic energy of the water. Accordingly, the incoming water with a high kinetic energy does not directly engage the electronic components 436 in the internal volume 418 of the housing 410.

The water deflector 440 can further include a pair of lateral openings 458, and a plurality of additional openings 456. The lateral openings 458 and the plurality of openings 456 are similar to the corresponding openings described above in relation to FIGS. 10-14.

Figure 17:
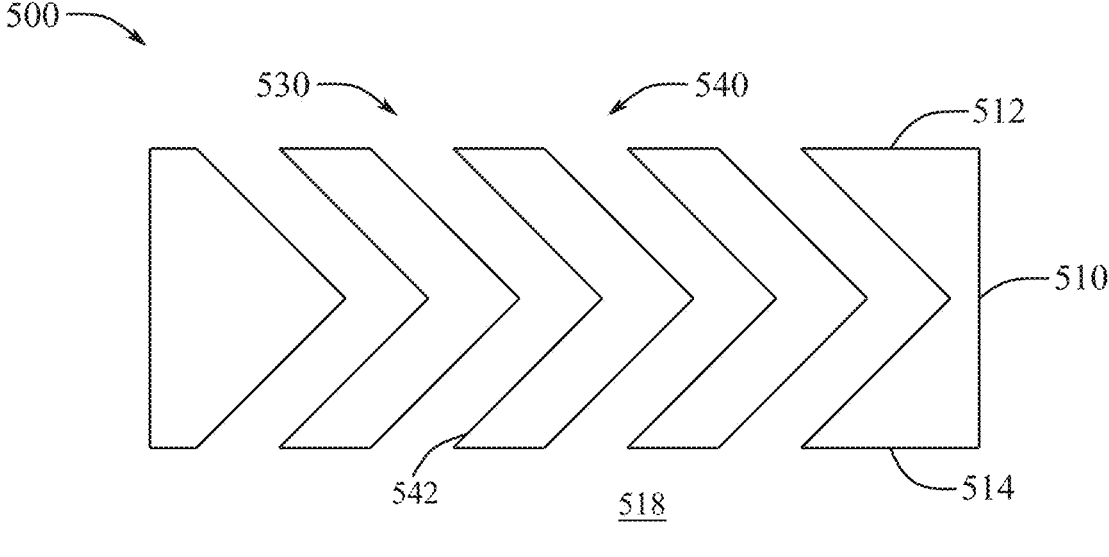
FIG. 17 illustrates an audio port with a plurality of openings forming a tortuous pathway, in accordance with some embodiments.

FIG. 17 illustrates another exemplary embodiment of an audio port 530 defined by a housing 510 of a portable electronic device 500. The audio port 530 includes a plurality of openings 540 that are defined by an external surface 512 and an internal surface 514 of the housing 510. The plurality of openings 540 formed directly in the housing 510 function as water deflectors to reduce an amount of energy of incoming water entering the audio port 530 of the housing 510. Each opening 540 includes a tortuous path for fluid communication with an external environment, and an internal volume 518 of the housing 510. In the illustrated embodiment, the plurality of openings 540 each include a similar geometry with non-perpendicular sidewalls 542 that are parallel with each other. The flow path of each opening 540 is configured to reduce the amount of energy of the incoming water, as the incoming water engages with the sidewalls 542.

Figure 18:
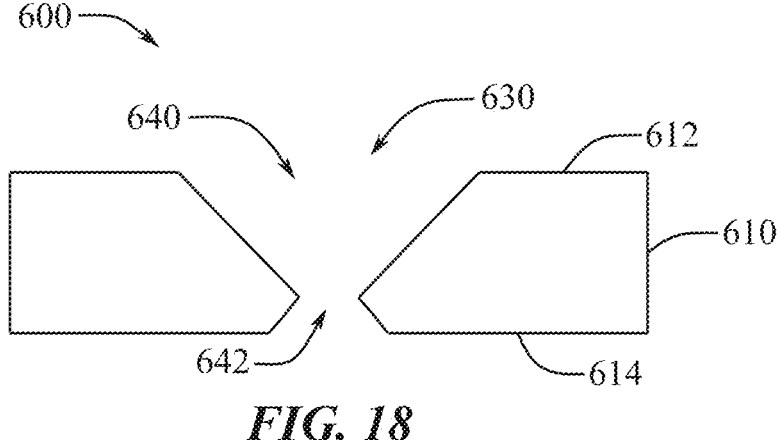
FIG. 18 illustrates an audio port with a tapered opening, in accordance with some embodiments.

FIG. 18 illustrates another exemplary embodiment of an audio port 630 formed directly in a housing 610 of a portable electronic device 600. The audio port 630 is illustrated as having a tapered opening 640 that functions as a water deflector. The opening 640 can have a tapered shape that tapers inward and then tapers outward. In other words, the diameter of the opening 640 decreases as the tapered opening 640 extends from the external surface 612 of the housing to an internal surface 614 to a predetermined transition point, and then increases until it reaches the internal surface 614. In the illustrated embodiment, the predetermined transition point is more than halfway through the housing 610. The transition from the decreasing diameter to the increasing diameter can create a bottleneck 642 that helps reduce the kinetic energy of the incoming water, while providing an expanding volume for exiting water.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A portable electronic device comprising:
   a housing defining:
       an internal volume,
       an electronic component disposed within the internal volume; and
       a port having a perimeter, the port defining a first width and a first length, and the port in fluid communication with the internal volume and an external environment;
   a water deflector disposed inside the internal volume adjacent to the port, the water deflector comprising a peak, the peak defined by linear opposing sides extending toward the port, the peak defining a second length and a second width, the second length is greater than the first length and the second width is greater than the first width across the port, and the peak extending away from the internal volume and centered in a width direction of the port; and
   wherein:
   the water deflector defines a plurality of openings; and
   the plurality of openings are aligned outside of the perimeter of the port.

2. The portable electronic device of claim 1, wherein the water deflector is connected to the housing.

3. The portable electronic device of claim 1, wherein a perimeter of the water deflector is connected to the housing.

4. The portable electronic device of claim 1, wherein the water deflector is connected to an electronic component disposed within the internal volume.

5. The portable electronic device of claim 1, wherein:

the water deflector comprises a deflector surface, the deflector surface including the peak and a curved surface adjacent to the peak; and the curved surface comprises an edge that curves back toward the peak.

6. The portable electronic device of claim 1, wherein the port comprises a first port, the water deflector comprises a first water deflector, and further comprising:

a second port defined by the housing; and a second water deflector disposed inside the housing adjacent to the second port;

wherein the first port is a speaker port and the second port is a microphone port.

7. A fluid deflector, comprising:

a body sized to extend at least a length and a width of a port of a housing of an electronic device; and an opening defined by the body, the opening defining a first length and a first width, and the opening configured to allow air to pass through or around the fluid deflector towards an electronic component disposed within an internal volume;

wherein the body forms a peak, the peak is defined by opposing linear sides extending away from the internal volume toward the opening across a second width at least as wide as the first width, and the peak is centered in a width direction of the opening;

wherein the body comprises a deflector surface, the deflector surface including the peak and a curved surface adjacent to the peak; and wherein the curved surface has an edge that curves back toward the peak.

8. The fluid deflector of claim 7, wherein:

the port is non-circular having a length and a width; and the peak is centered in the width of the port.

9. The fluid deflector of claim 7, wherein:

the port is non-circular having a length and a width; and the peak is centered in the length of the port.

10. The fluid deflector of claim 7, wherein the opening comprises a pair of lateral openings, each lateral opening is disposed on an opposite lateral end of the peak.

11. The fluid deflector of claim 7, wherein the body is connected to the housing.

12. The fluid deflector of claim 7, wherein the opening comprises a plurality of non-circular openings.

13. The fluid deflector of claim 7, wherein:

the body of the fluid deflector comprises a port-facing side and an internal-facing side; and the internal-facing side of the body comprises a hydrophobic coating.

14. The fluid deflector of claim 13, wherein the port-facing side of the body comprises a hydrophilic coating.

15. A portable electronic device comprising:

a housing defining:

an internal volume; and a port having a first length and a first width and the port in fluid communication with the internal volume and an external environment;

a water deflector comprising a body sized to extend at least the length and the width; and an opening defined by the water deflector, the opening configured to allow air to pass;

wherein the body defines a peak, the peak defined by opposing linear sides extending toward the opening, the peak extending a second length and a second width across the port, the second width and the second length is greater than the first width and the first length, the peak extending away from the internal volume and centered in a width direction of the port; and wherein the water deflector is connected to an electronic component disposed within the internal volume.

16. The portable electronic device of claim 15, wherein the port defines a perimeter and the opening is outside the perimeter.

17. The portable electronic device of claim 15, wherein the opening comprises a first opening and a second opening.

18. The portable electronic device of claim 17, wherein:

the first opening is disposed on a first side of the peak; and the second opening is disposed on a second side of the peak.

19. The portable electronic device of claim 15, wherein the opening defines a tapered cross-section.

* * * * *